(12) United States Patent
Yin et al.

(10) Patent No.: US 6,844,550 B1
(45) Date of Patent: Jan. 18, 2005

(54) MULTI-BEAM MULTI-COLUMN ELECTRON BEAM INSPECTION SYSTEM

(75) Inventors: Edward M. Yin, Cupertino, CA (US); Alan D. Brodie, Palo Alto, CA (US); N. William Parker, Fairfield, CA (US); Frank Ching-Feng Tsai, Saratoga, CA (US)

(73) Assignee: Multibeam Systems, Inc., Santa Clara, CA (US)

( * ) Notice: Subject to any disclaimer, the term of this patent is extended or adjusted under 35 U.S.C. 154(b) by 0 days.

(21) Appl. No.: 10/630,619

(22) Filed: Jul. 29, 2003

Related U.S. Application Data

(63) Continuation of application No. 09/789,180, filed on Feb. 19, 2001, now abandoned.
(60) Provisional application No. 60/183,724, filed on Feb. 19, 2000.

(51) Int. Cl.[7] .......................... G01N 23/00; G21K 7/00
(52) U.S. Cl. ....................................................... 250/310
(58) Field of Search ................................. 250/310, 311, 250/398

(56) References Cited

U.S. PATENT DOCUMENTS

| | | | |
|---|---|---|---|
| 4,390,789 A | 6/1983 | Smith et al. | 250/492.2 |
| 4,430,571 A | 2/1984 | Smith et al. | 250/492.2 |
| 4,661,709 A | 4/1987 | Walker et al. | 250/396 R |
| 4,694,178 A | 9/1987 | Harte | 250/396 R |
| 4,724,328 A | 2/1988 | Lischke | 250/492.2 |
| 4,742,234 A | 5/1988 | Feldman et al. | 250/492.2 |
| 4,902,898 A | 2/1990 | Jones et al. | 250/492.2 |
| 4,996,441 A | 2/1991 | Lischke | 250/492.2 |
| 5,363,021 A | 11/1994 | MacDonald | 315/366 |
| 5,384,463 A | 1/1995 | Honjo et al. | 250/398 |
| 5,430,292 A | 7/1995 | Honjo et al. | 250/310 |
| 5,502,306 A * | 3/1996 | Meisburger et al. | 250/310 |
| 5,557,105 A | 9/1996 | Honjo et al. | 250/310 |
| 5,578,821 A | 11/1996 | Meisberger et al. | 250/310 |
| 5,892,224 A | 4/1999 | Nakasuji | 250/310 |
| 5,981,962 A | 11/1999 | Groves et al. | 250/492.23 |
| 6,023,060 A | 2/2000 | Chang et al. | 250/310 |
| 6,157,039 A | 12/2000 | Mankos | 250/492.2 |
| 6,252,412 B1 * | 6/2001 | Talbot et al. | 324/750 |
| 6,465,783 B1 * | 10/2002 | Nakasuji | 250/311 |
| 6,509,750 B1 * | 1/2003 | Talbot et al. | 324/750 |
| 6,734,428 B2 * | 5/2004 | Parker et al. | 250/310 |
| 6,738,506 B2 * | 5/2004 | Miller et al. | 382/151 |
| 6,750,455 B2 * | 6/2004 | Lo et al. | 250/346 |
| 2001/0032939 A1 | 10/2001 | Gerlach et al. | 250/492.3 |

FOREIGN PATENT DOCUMENTS

WO     WO 98/48443     10/1998

* cited by examiner

*Primary Examiner*—John R. Lee
*Assistant Examiner*—Johnnie L Smith, II
(74) *Attorney, Agent, or Firm*—David Jaffer; Pillsbury Winthrop LLP

(57) ABSTRACT

A multi-column electron beam inspection system is disclosed herein. The system is designed for electron beam inspection of semiconductor wafers with throughput high enough for in-line use. The system includes field emission electron sources, electrostatic electron optical columns, a wafer stage with six degrees of freedom of movement, and image storage and processing systems capable of handling multiple simultaneous image data streams. Each electron optical column is enhanced with an electron gun with redundant field emission sources, a voltage contrast plate to allow voltage contrast imaging of wafers, and an electron optical design for high efficiency secondary electron collection.

17 Claims, 16 Drawing Sheets

MULTI-BEAM MULTI-COLUMN ELECTRON BEAM INSPECTION SYSTEM

CROSS-REFERENCE TO RELATED APPLICATIONS

This application is a continuation of U.S. patent application Ser. No. 09/789,180 filed Feb. 19, 2001 now abandoned, which claims the benefit of U.S. Provisional Application No. 60/183,724 filed Feb. 19, 2000.

BACKGROUND OF THE INVENTION

1. Field of the Invention

This invention relates to the field of wafer defect inspection, and in particular to wafer inspection using charged particle beams.

2. Description of the Related Art

Defect inspection of semiconductor wafers and masks for IC manufacturing is an accepted production process for yield enhancement. The information obtained from a wafer defect inspection tool can be used to flag defective dies for repair, or to improve wafer processing parameters. The systems used for inspection are typically optical in nature and such systems are limited in resolution due to the wavelength of the measuring light (200-400 nm). Although possible, it becomes increasingly difficult to detect defects that are smaller than the wavelength of the measuring light. Defects can range in both size and shape, and have been measured to be as small as one quarter the size of the critical dimension (CD) (Hendricks et. al., SPIE vol. 2439 pp. 175–183, 1995). For example, in order to short two adjacent traces, a conductive shorting defect can be significantly thinner than the traces, and yet still cause the circuit to fail. As the feature sizes on semiconductor wafers drops below 0.18 $\mu$m, conventional optical inspection techniques will have difficulty detecting the smaller-sized defects.

To overcome this resolution limit, several electron beam inspection systems have been designed. The formation or creation of an image in an electron beam inspection system is similar to that of a Scanning Electron Microscope (SEM). A primary beam of electrons from an electron column is focused to a small spot on an object that is to be imaged (e.g. a silicon wafer containing microcircuits). The primary beam of electrons interacts with the object such that the object emits electrons. The electrons emitted from the object are typically classified into two groups: those with low energy (less than roughly 50 eV) are called secondary electrons; those that are emitted with high energy (close to the energy of the primary beam) are called backscattered electrons. Secondary electrons are emitted from a region close to the surface of the object and therefore give topographical information. Backscattered electrons can come from deeper within the object and typically give information about the atomic composition of the object, with only minor topographical information. Signal information is collected to form an image by detecting either secondary, backscattered or both types of electrons. An image is formed by scanning the primary beam over the object in a raster fashion—such as in a television or cathode ray tube—and collecting the secondary/backscattered electrons. The signal from the detected electrons is displayed synchronously with the primary beam raster on a display monitor, or stored on photographic film or computer memory. Magnification is achieved by the ratio of the size of the raster scan on the object and the size of the display. The information from images can be divided into small regions called pixels for digitization and computer manipulation. Typically the size of the focused electron beam is between one and two times the pixel size for optimum image quality.

In order to optimize the imaging process using an e-beam system, a knowledge of the materials is required. The object materials for imaging under an electron beam fall into two categories: conductive and insulating materials. Special care must be used when imaging insulators as they charge under electron bombardment. In some cases charging of the insulators can be so severe that no useful image can be obtained. The charging of materials occurs when there is an imbalance between the number of electrons striking the object and the number of electrons leaving the object. The number of electrons that leave the surface is dependent on the primary beam energy. The ratio of the number of electrons leaving the surface to the number of electrons hitting the surface is typically larger than one when the primary beam is in the energy range of 200–2000 eV. For insulating materials when the number of electrons leaving the surface is greater than the number entering the surface, the surface charges positively until an equilibrium voltage is reached. When the primary beam energy is outside this range the number of electrons leaving the surface is less than the number entering and the surface charges negatively until an equilibrium voltage is reached. Therefore it is practical to image insulating materials in low voltage mode with the primary beam energy less than 2000 eV. Integrated circuits or microcircuits are comprised of both conducting and insulating materials and therefore low beam voltage operation is preferred.

Electron beam systems can have much higher resolution than optical systems because the wavelength of the electron can be in the angstrom regime. Present SEMs can have resolution down to 10 Å or even less, operating at currents less than 1 nA. Electron beam systems are limited in the speed at which they can inspect wafers. In present systems, throughputs of approximately 30 minutes per square cm have been reported (Hendricks et al, SPIE vol. 2439, pg. 174). Thus to inspect an entire 300 mm diameter silicon wafer, approximately 70 hours will be required. These systems can be used in a sampling mode where only several dies are inspected, thereby increasing throughput to several hours per wafer. These systems have been effective for research and product development, but are impractical for volume production. These electron beam inspection systems have a single electron beam that images the wafer. There are two insurmountable problems for a single electron column system to achieve sufficient wafer inspection throughput. First, space charge effects significantly reduce resolution when the electron current is increased for adequate signal-to-noise ratios. Second, the data rate from a single column is obtained serially from the electron detectors within the column; as imaging resolution increases, this data rate cannot be handled by present-day image computers. An estimated 10–20 Gbytes/s data rate is required.

An electron beam inspection system with high resolution and throughputs of several wafers per hour could be used to inspect parts of each wafer, or perhaps to inspect one or more complete wafers out of a cassette during the time required to complete a single processing step for all the wafers. Such an in-line wafer defect inspection tool would significantly increase the yield of ICs for chip manufacturers.

SUMMARY OF THE INVENTION

An electron beam inspection system is described which is comprised of an electron optics assembly for generating multiple electron beams, a voltage contrast plate to allow voltage contrast imaging of a wafer, multiple secondary electron detectors for simultaneous imaging of a wafer using multiple electron beams, a wafer stage with six degrees of freedom of movement, multiple image storage memory devices connected to the secondary electron detectors, multiple image computers connected to the image storage memory devices, multiple post-processors connected to the image computers, and a display connected to the multiple post-processors. Further embodiments of the inspection system have beveled edges to the openings in the voltage contrast plate, so as to produce a field-free region at the wafer. Furthermore, the electron optics assembly comprises multiple electron beam columns. In preferred embodiments the electron optics assembly is comprised of electrostatic electron optical components. An electron beam column is comprised of an electron gun, an accelerating region, a blanking aperture, deflectors, focus lenses, and a field-free tube. In preferred embodiments the electron gun comprises an array of individually operable field emission cathodes bonded to an array of beam limiting apertures. Furthermore, the accelerating region may comprise of an alignment deflector, accelerator plates and a shield electrode. The deflectors may comprise of a mainfield deflector and a sub-field deflector.

DETAILED DESCRIPTION

The invention disclosed herein is a high resolution electron beam wafer defect inspection tool that utilizes a multiple column, multiple source assembly to achieve wafer inspection at high throughput (suitable for in-line use in a semiconductor fabrication facility). The multiple columns allow for high throughput wafer inspection (up to several wafers per hour), and the multiple sources allow for both source redundancy, which will significantly decrease tool downtime and reduce service costs, and allow for more than one beam per column for advanced imaging. The tool is designed for the detection of defects for features with critical dimensions (CDs) in the range 25 nm–100 nm.

Figure 1:
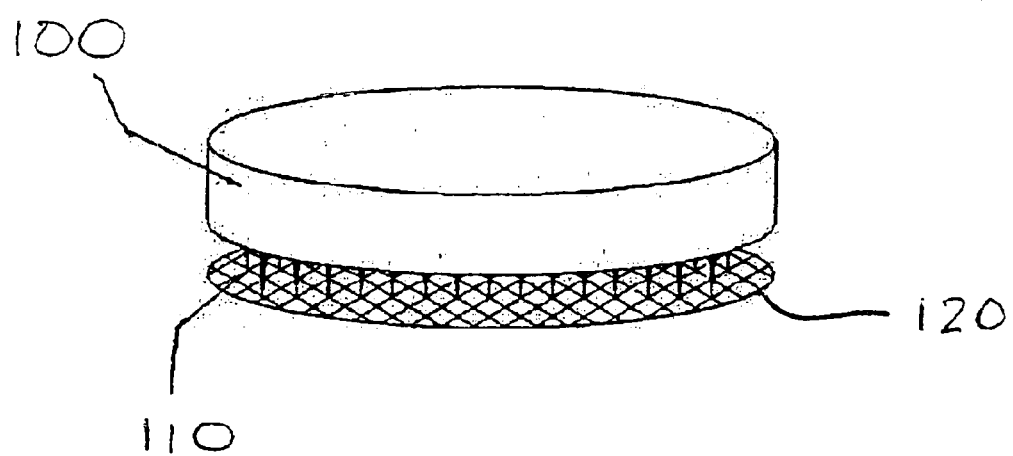
FIG. 1 shows a top plan view schematic of a multi-column assembly over a wafer; one electron beam per column is shown.

The electron beam inspection tool has multiple electron optical columns, each with its own electron source. There are no magnetic components in any of the columns—all of the focusing lenses and scanning deflectors are electrostatic. FIG. 1 shows a schematic of a multi-column assembly 100, positioned over a wafer 120. Such an assembly may typically consist of 50–200 individual columns. Each column has an individual electron beam 110. On hitting the wafer 120, each electron beam 110, creates secondary electrons that are collected using electron detectors located at the bottom of each column. The multiple column approach circumvents both of the primary problems that arise when using a single column: space charge effects due to high electron current and high data rate from a single detector. Calculations using SIMION 3D, ver 6.0 (a charged particle ray tracing program developed by David Dahl at the Idaho National Engineering Lab) and MEBS (an electron beam analysis software package developed by Munro's Electron Beam Software Ltd.) indicate that high resolution (<25 nm) spot sizes can be achieved at the required electron current levels for each column. Also by using multiple columns, the wafer can be simultaneously imaged by all of the columns, significantly increasing the wafer throughput. Thus, the overall high data rate of roughly 20 Gbytes/s can be distributed among the electron detectors of all the columns. For example, with 200 electron columns, each detector would only require a 100 Mbytes/s data rate, which is achievable with existing detector hardware and imaging computers.

In one embodiment of the present invention there are roughly 200 columns distributed over a 300 mm diameter wafer. Each column covers a footprint of 20×20 mm in size over the wafer. In another embodiment of the present invention, this column footprint can be 40×40 mm, corresponding to approximately 56 columns over a 300 mm diameter wafer. In other embodiments, the column footprint can be any size in between 20×20 mm and 40×40 mm, including rectangular shapes. The minimum size of the column footprint is primarily dependent on the mechanical size limitation necessary to make all of the electrical connections to each column. A large column footprint decreases the number of total columns used, and therefore increases the bandwidth required by each electron detector and imaging computer. Therefore, the maximum size of the column is dependent on the maximum achievable data rate. Also, a larger column footprint requires an increased stage travel, as will be explained below. The eventual size of the column footprint will be an optimization of these parameters.

In a multiple column inspection system, many individual images will be collected in parallel. Each column will have the following: its own source for generating electrons, lenses for focusing the electron beam, a scanning mechanism for raster scanning the beam over the wafer, and a detector for collecting the secondary electron signal.

Inspection of a wafer for defect detection in IC manufacturing is currently performed in the following modes: array, die-to-die, and die-to-data base modes. Defects can be detected by comparing an image of the location under inspection with an area that contains the same pattern information that is either generated from a data base or acquired from another region on the wafer. In the die-to-die mode the pattern information is acquired from the corresponding area of a neighboring die. In array mode the pattern information is acquired from the same die but from an area of a repeating pattern such as that of a DRAM. These comparisons are done with a specialized image computer.

A critical element of the multiple column approach will be the alignment of the images or data from each column, so that a comparison of different areas on the wafer is performed with the same pattern information. Ideally, all the columns would have a pitch or spacing that was equal to the die or reticle pitch or spacing. (A reticle field is the area printed by a mask which can contain more than one die or chip.) In this case all the columns would be aligned with the same image information. In the case where the column pitch is not equal to the die or reticle field pitch, two approaches can be used. In one approach the column could be moveable. Placement of the columns could be done with small motors and alignment information can be obtained by measurement of the die pitch. This measurement could be performed optically in either a pre-inspection module during wafer loading or if optical measurement was placed in-situ with the columns and fine alignment could be done using the individual columns. Fine alignment needs to be at the level of several pixels, because a mismatch of several pixels can yield a false interpretation of the data in the image computer. A second approach would be to align the image data electronically in a computer memory. In this approach exact measurement of die alignment marks would have to be performed in several steps by groups of columns. Each group of columns would consist of the columns that do align with the die. For example, if the column spacing is 20 mm by 20 mm and the die are 15 mm by 15 mm then the columns align with the dies on a pitch of 60 mm×60 mm. In this case there would be 4 groups of columns. After each group has obtained it's positional information, then location pointers can be used in the data acquisition to align common pattern images or data.

Figure 2:
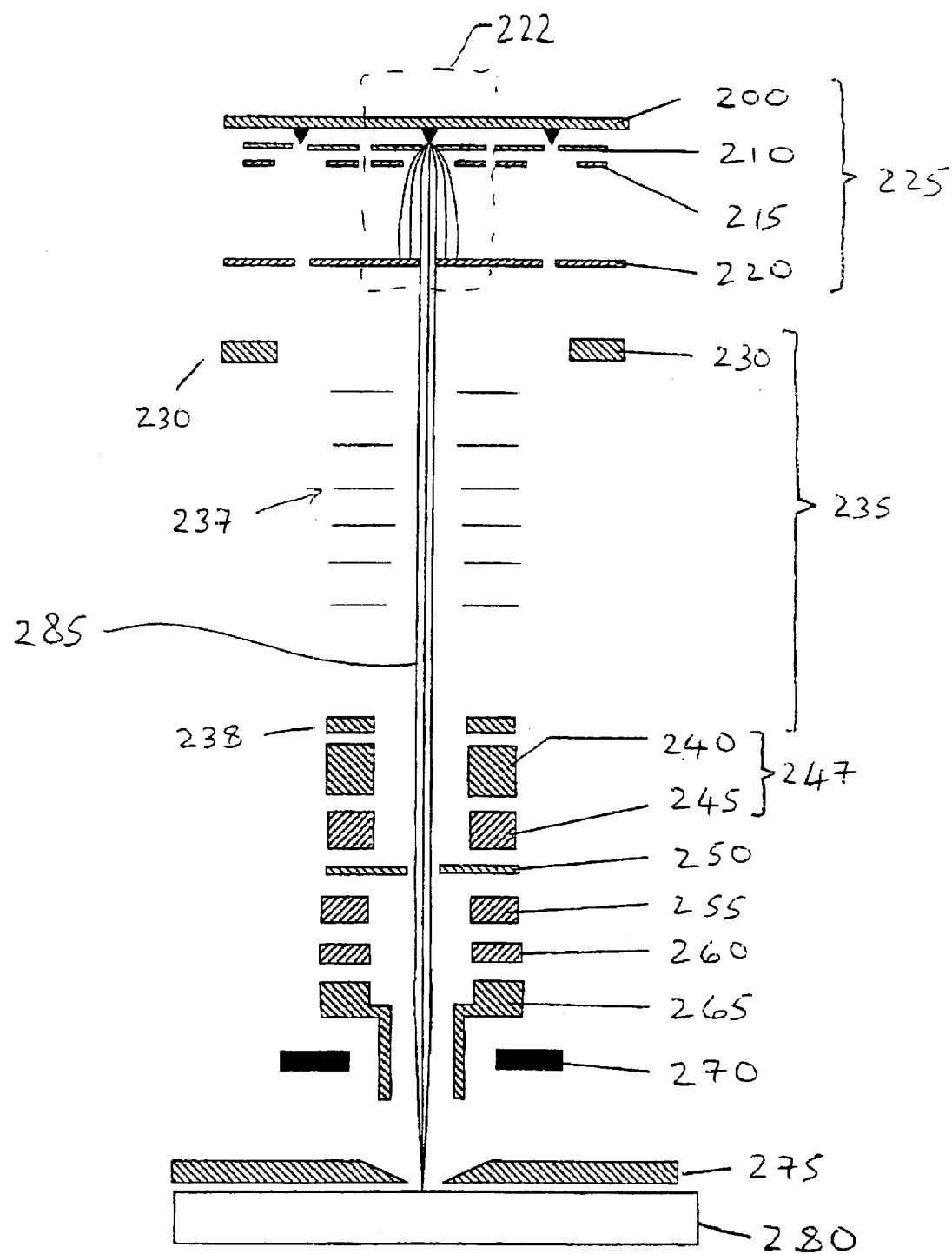
FIG. 2 shows a schematic cross-sectional representation of a single column.

A schematic cross-sectional representation of a single column is shown in FIG. 2, including the source substrate 200, field emitting tips 205, gate electrodes 210, focus electrode 215, beam limiting aperture 220, electron source 222, electron gun 225, alignment deflector 230, accelerating region 235, accelerating plates 237, shield electrode 238, mainfield deflector 240, subfield deflector 245, scanning deflectors 247, blanking aperture 250, focusing lens 1 255, focusing lens 2 260, field-free tube 265, secondary electron (SE) detectors 270, voltage contrast plate 275, wafer 280 and electron trajectories 285. Each column is roughly 160 mm in length, with the majority of the length represented by the accelerating region 235 between the electron gun 225 and the deflectors 240 & 245. Only 3 out of the 100 electron sources 222 in the preferred embodiment of the invention are shown in FIG. 2. The function and operation of each component within the column will be discussed in detail below.

Referring to FIG. 2, each electron optical column can be broken into 3 main sections: (1) the electron gun 225, comprising a field emission source 222, focusing optics 215, and beam limiting aperture 220; (2) the accelerating region 235 and scanning deflectors 247, comprising the alignment deflector 230, accelerating plates 237, shield electrode 238, mainfield deflector 240 and subfield deflector 245; and (3) the focusing electrodes comprising the focusing lens 1 255, focusing lens 2 260, field free tube 265, voltage contrast plate 275 and wafer 280, and SE detectors 270. A simplified view of the column operation is as follows. The electron gun 225 creates a narrow, focused electron beam. The beam limiting aperture 220 defines the electron beam semi-angle which is the electron optical equivalent to the numerical aperture (N.A.) of a light optical system. The alignment deflector 230 precisely steers the beam down the center of the column. The electron beam is accelerated to high energy through the accelerating region 235. The focusing electrodes focus the beam to a small spot on the wafer while the scanning deflectors 240 & 245 scan the beam over the wafer 280 in a raster scan. The secondary electrons created by the primary beam are captured by the SE detectors 270. Topographical information is determined by the secondary emission yields of the features on the wafer surface. The signal from the SE detectors 270 is passed on to an imaging computer for image processing and defect detection.

Consider a 300 mm diameter wafer with a total of 201 columns (for the preferred embodiment of the present invention) simultaneously image the surface of the wafer. Each column covers an approximately 20 mm×20 mm square footprint on the surface of the wafer, and each column is required to image the entire 20×20 mm footprint. Thus, the entire surface area of the wafer is covered by the 201 columns. In the preferred embodiment there is one active electron beam per column.

Figure 3:
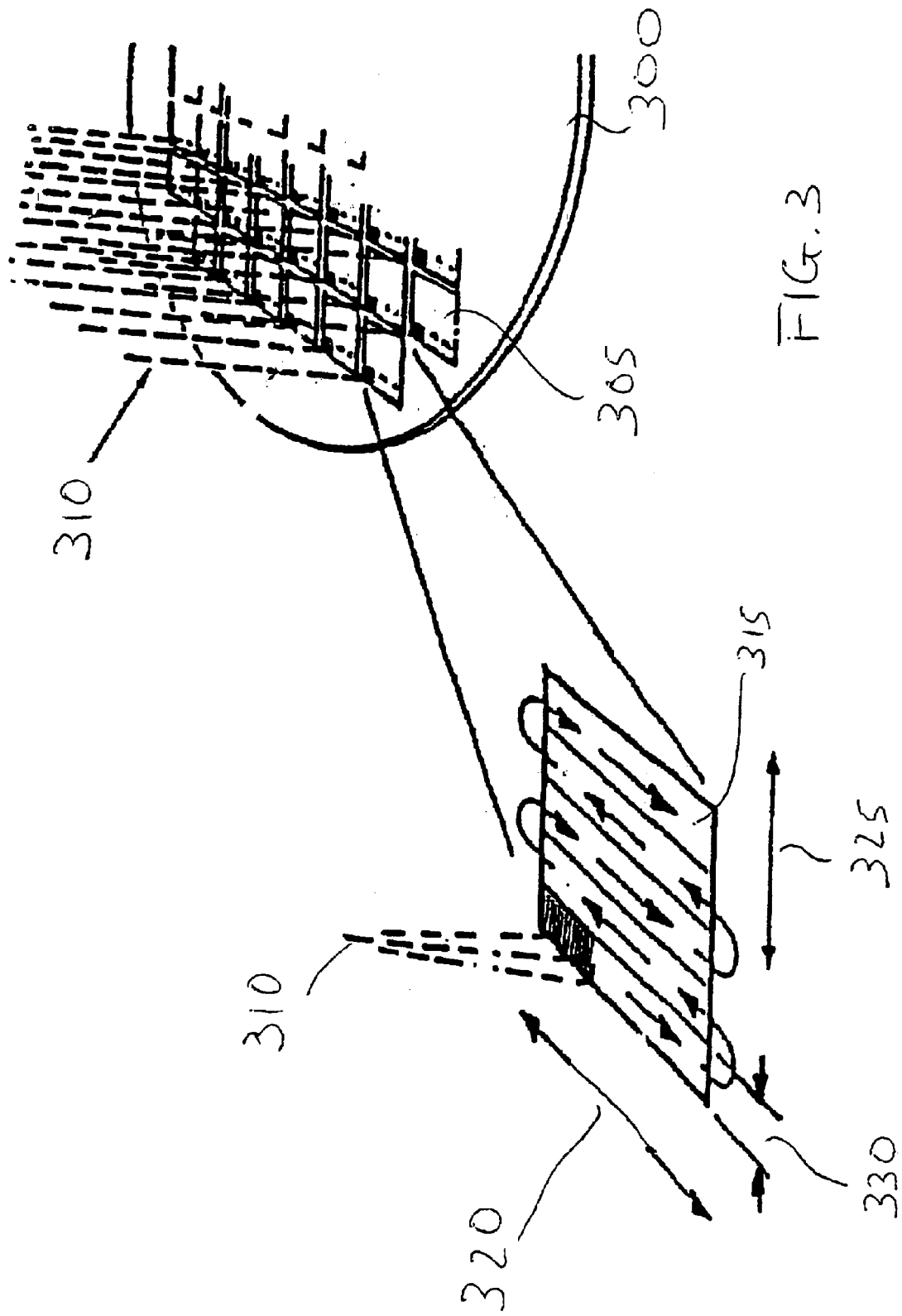
FIG. 3 illustrates an imaging strategy for a multi-column electron beam inspection system.

An imaging strategy incorporating stage motion is shown schematically in FIG. 3, which shows a wafer 300, the imaging area 305 for each column, the electron beam 310 from each column, an imaging stripe 315 imaged by a single electron beam, and the X-Y axes for the stage and scan motion 320 & 325. The column footprint is roughly 20×20 mm in the preferred embodiment of the present invention, and is equal to the imaging area 305 for each column. The entire wafer will be completely imaged when one column has completed its scan of its imaging area 305, because the entire wafer is being simultaneously imaged by all 201 columns. The area imaged by a column is comprised of a series of imaging stripes 315 where an imaging stripe is defined as the area scanned in the X-direction 325 by the electron beam during a single stage travel in the Y-direction 320 and extends across the whole length of the column footprint. In the preferred embodiment of the present invention, the imaging stripe width 330 is 10 $\mu$m. In a preferred embodiment the width of each stripe is composed of 400 imaging pixels, where each pixel is 25 nm×25 nm, although the pixel size can be smaller or larger depending on the resolution required. As the beam is scanned across this 10 $\mu$m stripe in the X-direction 325, the stage is slowly scanned in the Y-direction 320. As the stage scans across the entire footprint of the column, the resulting stripe is 20 mm long in the Y-direction 320 and 10 $\mu$m wide in the X-direction 325. After completing one 20 mm pass across the imaging area 305; the stage steps the wafer 300 by 10 $\mu$m in the X-direction 325, and travels back across the column footprint in the direction opposite to its first pass, as depicted in FIG. 3. This process is repeated until the entire 20 mm×20 mm area is imaged with approximately 2000 imaging stripes. The wafer stage motion is called a serpentine motion (back-and-forth, imaging in both scan directions), covering the full 20 mm square imaging area with about 2000 imaging stripes. Since all of the columns are imaging at the same time, the time taken to cover one imaging area is also the time that it takes to image the entire 300 mm wafer.

The following sections describe the detailed operation of each component of the electron optical column, starting from the electron gun and traveling down to the wafer.

The position of the electron gun 225 within the electron optical column can be seen in FIG. 2. In standard terms, this is considered the "top" of the column (at the top of FIG. 2), and the wafer 280 is located at the "bottom" of the column (at the bottom of FIG. 2). Each column has its own electron gun 225. In a preferred embodiment of the present invention, the electron gun 225 consists of an, array of microfabricated cold cathode emitters combined with a beam limiting aperture 220; the emitters and the beam limiting aperture 220 are microfabricated on their own die, followed by a flip-chip bond that affixes the two die together. The details of the structure and fabrication of this embodiment of the electron gun 225 are found in Parker et al. "Electron optics for multi-beam electron beam lithography tool" US nonprovisional patent application filed Nov. 23, 2000, which is incorporated herein by reference.

Figure 4:
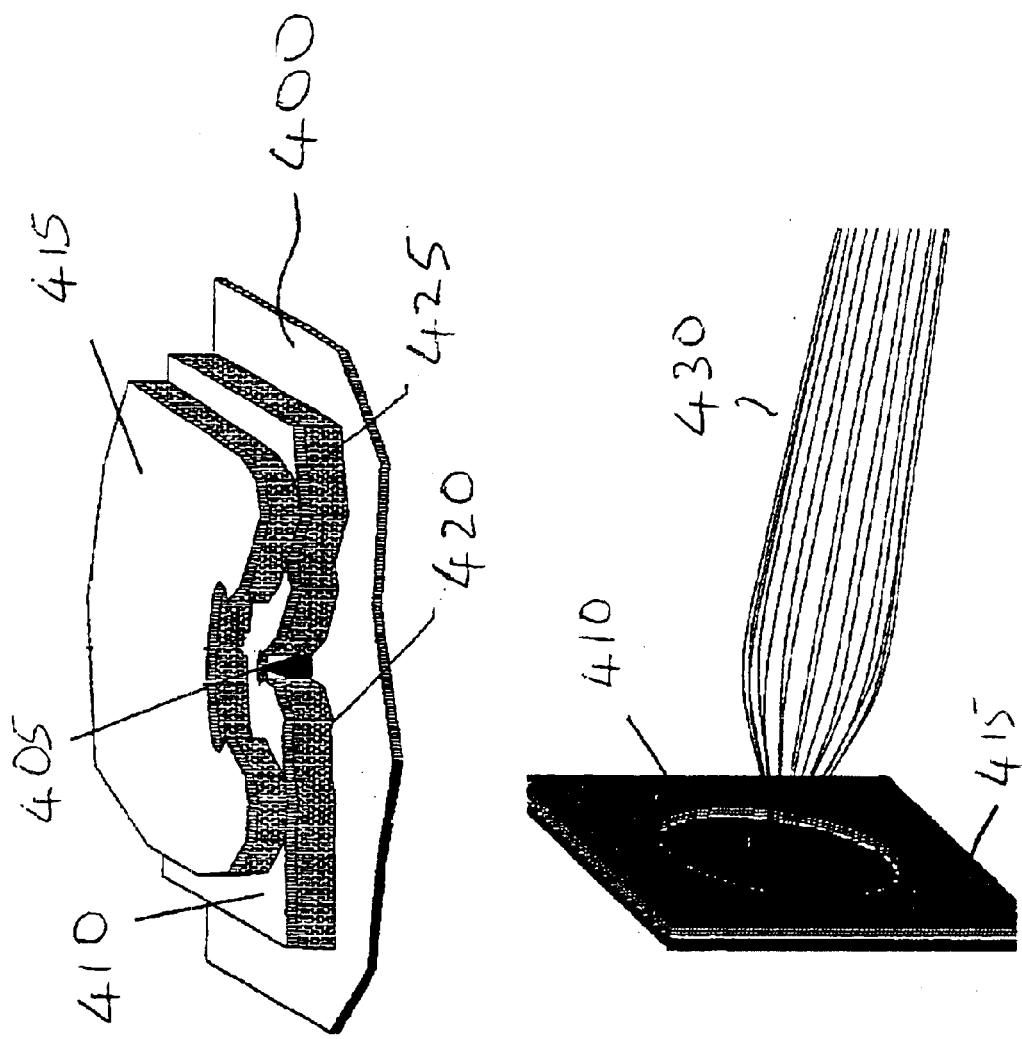
FIG. 4A shows a schematic representation of a field emission source, as used in a multi-column electron beam inspection system.
FIG. 4B illustrates electron beam trajectories for the source of FIG. 4A.

FIG. 4A shows a schematic representation of field emission source and FIG. 4B illustrates the electron trajectories for said source, as modeled using SIMION 3D, ver 6.0. FIGS. 4A & 4B show the source substrate 400, field emission tip 405, gate electrode 410, focus electrode 415, tip-to-gate insulator 420, gate-to-focus insulator 425 and electron trajectories 430. The electron gun is composed of an array of such field emission tips. In the preferred embodiment only one tip will be operational per column at any given time. Due to the possible short lifetime of these tips, an array of tips can be used to allow for a large amount of redundancy. This significantly increases the electron gun lifetime. The number of tips in an array can be as small as one (a single tip), or as large as 10,000 (an array of 100×100 tips); each tip has the property to be individually addressable. Each tip 405 will require a focusing electrode 415 and a beam limiting aperture, although these do not need to be independently controlled for each tip on the source. After the electrons are emitted from the tips, they are focused into a parallel beam by the integrated focusing electrode 415. This electrode is microfabricated and self-aligned to the gate hole to ensure minimal beam deflection and aberrations. The beam limiting aperture 230 selects a small portion of the total tip current and allows this to pass down the column, as shown in FIG. 2. The part of the electron current that passes through the beam limiting aperture 230 is referred to as the "beamlet". One of the key requirements for the electron gun is the beam divergence of this beamlet as it leaves the aperture. A beam divergence of less than 0.05° half angle is required so that the beam does not increase significantly in diameter as it passes through the scanning deflectors 247. By minimizing beam size, beam aberrations from the column optics are minimized. The beam limiting aperture 230 will be on the order of 1–10 $\mu$m in size, and will typically be circular in shape. The current passing though each aperture down the column will be roughly 10 to 100 nA. In a preferred embodiment, the electron optics is designed such that a majority of the current that passes through the beam limiting aperture will reach the wafer 280.

Figure 5:
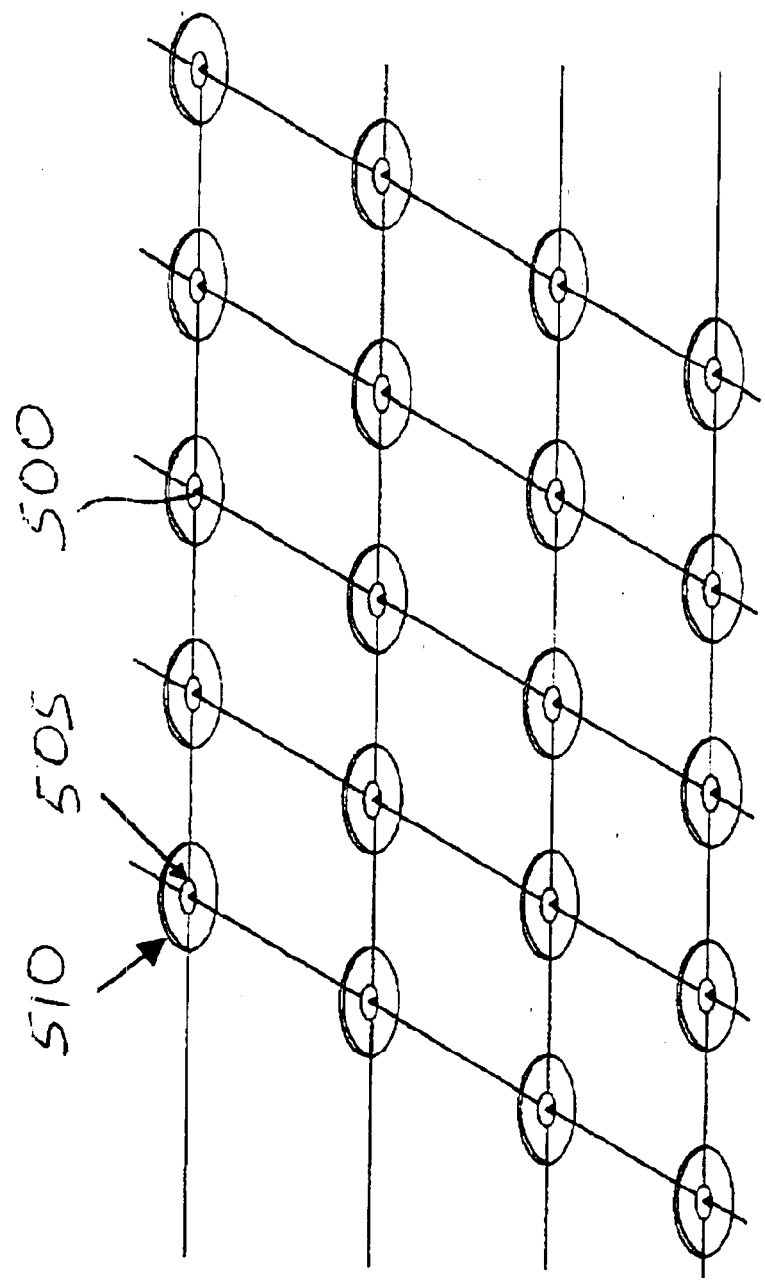
FIG. 5 shows a schematic representation of an array of field emission sources, as used in a multi-column electron beam inspection system.

FIG. 5 shows a schematic of a 4×5 array of the field emission tips, indicating the tips 505, gate holes 510 and focus holes 515. There may be as few as one tip or as many as thousands, if an X-Y matrix addressable scheme to individually address a tip is used. A single tip gun would require a lifetime significantly longer than the required mean time between servicing of the inspection tool, whereas in a gun with multiple tips another tip could be activated if and when one tip were to fail. This would significantly increase the lifetime of the gun and increase the mean time between failure (MTBF) for the inspection tool containing such a gun. The disadvantage of increasing the number of tips is the increase in fabrication complexity and the larger number of electrical interconnects required. The alignment deflectors 230 (see FIG. 2) will need to be re-adjusted as different tips are turned on, but this should be a very quick process with a short tool downtime (expected to be less than 5 minutes).

Field emission tips 500 (see FIG. 5) are typically small molybdenum cones. The cone is centered in a small extraction, or gate hole 505, and a potential difference is applied between the gate electrode and cone in order to extract electrons from the cone by the field emission mechanism. The I-V (current-voltage) characteristics of the device are generally in accord with the Fowler-Nordheim equation. Cold cathode emission has an energy spread, typically less than ±0.5 eV, which is required for the electron optical design of the column, in preferred embodiments. Each tip will be operated using a current feedback circuit to regulate the emitted current, as described in Parker et al. "Electron optics for multi-beam electron beam lithography tool" US nonprovisional patent application filed Nov. 23, 2000, which is incorporated herein by reference. This will significantly improve current stability in the electron beamlet. The current regulation circuit can correct for current fluctuations with a bandwidth of roughly 1 MHz. Some fluctuations can occur with a time constant on the order of picoseconds, and thus cannot be eliminated using the regulation circuit. These fast fluctuations can be significantly reduced or eliminated by using a current pulsing process, such as that described in "Low Voltage Field Emission of Electrons and Ions from Cold Metals" R. Olson, Ph.D. Thesis, The University of New Mexico, 1999. The current-voltage (1-V) characteristics of the field emission current can be monitored during operation. When the I-V characteristics degrade beyond a certain threshold value for a particular source, that particular source can be turned off at the next convenient time (e.g., between inspection of wafers) and another source can be activated as a replacement. This process should prevent the majority of source failures during the imaging of a wafer.

In a preferred embodiment of the present invention, the gun has a 10×10 array of field emitters on an approximately 100 $\mu$m center-to-center spacing. The cones are made from molybdenum and are approximately 1 $\mu$m tall within an approximately 1 $\mu$m diameter gate hole. The focus hole is 15 $\mu$m in diameter. There is a beam limiting aperture for each cone, with each aperture being 3 $\mu$M in diameter and located 200 $\mu$m away from the tips (along the emission axis). The gate electrodes are individually addressable using an X-Y matrix addressing scheme, and the focus and aperture electrodes are common to all of the sources. Typical operating base current from a cone is approximately 2 $\mu$A, with a typical beamlet current (passing through the beam limiting aperture) of 30 nA. The cones can be pulse conditioned to keep the beamlet current and angular emission stable. The pulse conditioning is applied throughout the imaging process; for example, the base current is pulsed to 1 mA for a duration of 1 microsecond with a repetition rate somewhere between 1 Hz and 0.001 Hz.

In other embodiments of the present invention, the cone material can be different from molybdenum and may include: Pt, Ni, Ir, Re, Si, or metallized Si. The size of the array can vary anywhere from 1×1 to 100×100 or beyond, the only limitation being the electrical connections and physical size of the source. Also, different electron emitters can be used as the electron source—a few requirements are compact size, feasibility of fabrication into an array, high brightness of electron emission, emission stability, and long lifetime. Examples of alternative sources include planar cathodes or single crystal tungsten thermal emitters. It is also possible to use a single electron source for each column, rather than an array, including sources that are not microfabricated, e.g. Schottky emitters.

In a further embodiment of the present invention, more than one source per column could be emitting simultaneously, resulting in more than one beamlet per column at the wafer. This has the potential to improve the inspection tool throughput.

As shown in FIG. 2, the accelerating region 235 and scanning deflector region 247 of the electron optical column represents the vast majority of the length of the column, which is roughly 160 mm in a preferred embodiment of the invention. Due primarily to the small scale of the column, all of the lenses, rotators, deflectors, blankers, etc. are electrostatic; no magnetic elements are used. Concerns with magnetic elements include the complexities of the fabrication on such a small scale, and magnetic screening of one column from the next in the closely packed array of columns. Most of the column components are precision-machined metals, insulating ceramics and conductive ceramics. Some of the more complex metal electrodes are screen printed onto ceramic; simpler electrodes maybe be brazed to ceramic. Standard mechanical and optical alignment techniques are utilized to ensure that all components are properly situated.

Each electron source 222 within a column provides a narrow, parallel beamlet of electrons 285 that pass through the column. The alignment deflector 230 steers the beamlet 285 down the column into the ideal position for the lower column optics. This alignment deflector 230 is an independent deflector for each column in the multi-column inspection tool. In the preferred embodiment of the present invention, the alignment deflector 230 is a set of double octupole deflectors. The purpose of the alignment deflector 230 is to make every source appear as if it is emitting directly on the optical axis of the column. Two deflectors are required because both trajectory and position need to be corrected. The first deflector "pushes" the beamlet towards the center of the optic axis, and the second deflector "pulls" the beamlet such that the trajectory of the beamlet is directly parallel to the optical axis. On-axis beams have significantly less aberrations when passing through lenses and deflectors.

Figure 6:
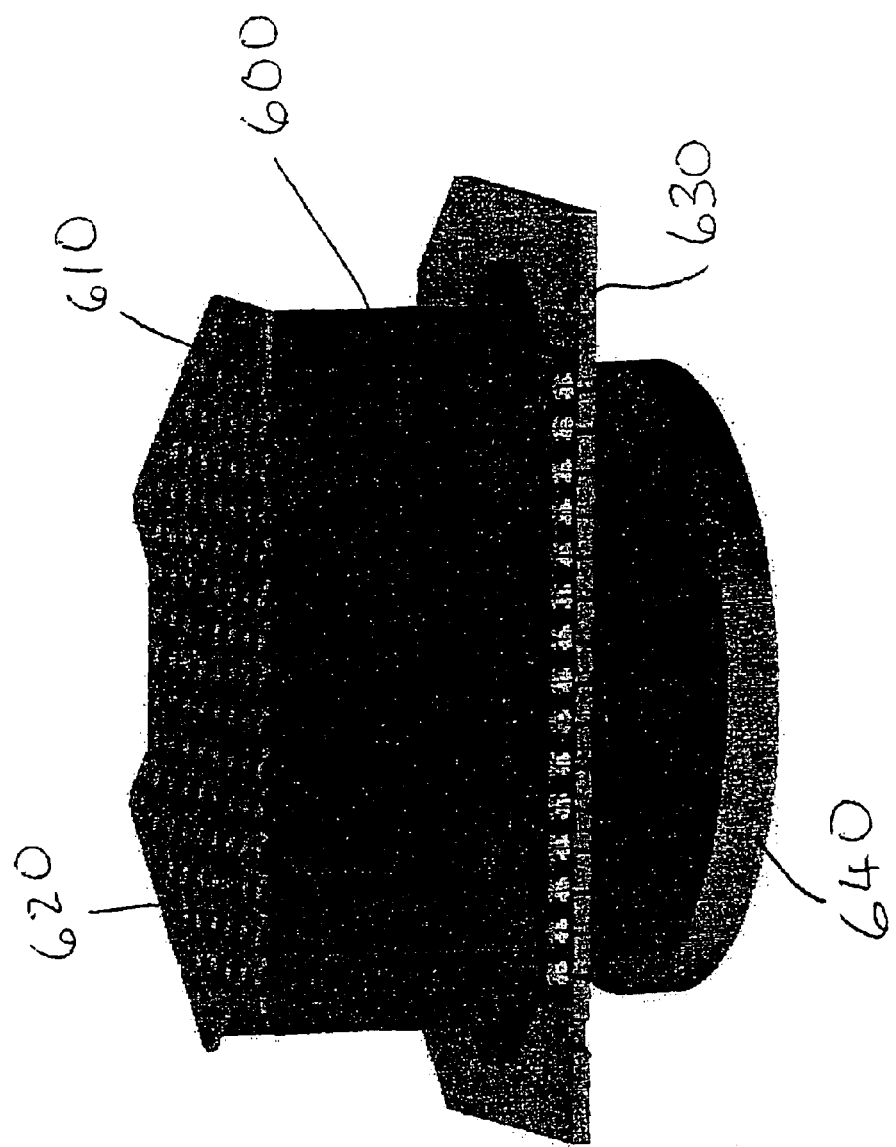
FIG. 6 shows a schematic cross-sectional representation of accelerating and deflection components of a multi-column electron beam inspection system.

The longest part of the column is an accelerating region 235 that accelerates the electrons from roughly 100 eV to roughly 6000 eV. In the preferred embodiment of the present invention, the accelerating region 235 can be made up of an array of metal shims that extend over the whole area of the wafer and accommodate the accelerating region for all of the columns simultaneously; this is shown schematically in FIG. 6, which shows the metal shims 600, holes in the shims 610 through which the electrons travel, source plate 620, deflector assembly 630 and wafer chuck 840. An open system like this will also allow for better vacuum pumpout of the system, which is critical for the field emission sources. The shims 600 are typically metal, and can be made from beryllium copper or any other non-magnetic material. Typical column bore diameters are roughly 10 mm. The applied potential at each plate increases linearly from 100 V to 6000 V. The accelerating column can also be made from resistive ceramic in one piece. A linearly increasing potential is desirable because it does not introduce lensing effects in the beam that could distort the beam shape. In other embodiments of the accelerating region, the metal shims can be replaced with thin, interwoven mesh with holes for the column bores. In a further embodiment, the metal shims can be removed altogether, provided that a uniform accelerating field can be established, and if the deflection voltages can be suitably shielded between adjacent columns.

As seen in FIG. 2, after passing through the accelerating region 235, the electrons pass through the shield electrode 238 and the mainfield and, sub-field scanning deflectors 240 & 245. The shield electrode 238 is the last electrode in the accelerating region 235 and defines the start of the deflector region. It is typically made of a metal, metallized ceramic or conducting ceramic plate. In the preferred embodiment of the present invention, the shield electrode 238 defines the final voltage of the accelerating region, and the dc voltage at which the deflectors 247 are operated. In another embodiment, the shield electrode is eliminated and the final voltage of the accelerating region 235 is defined by the mainfield deflector 240.

Figure 7:
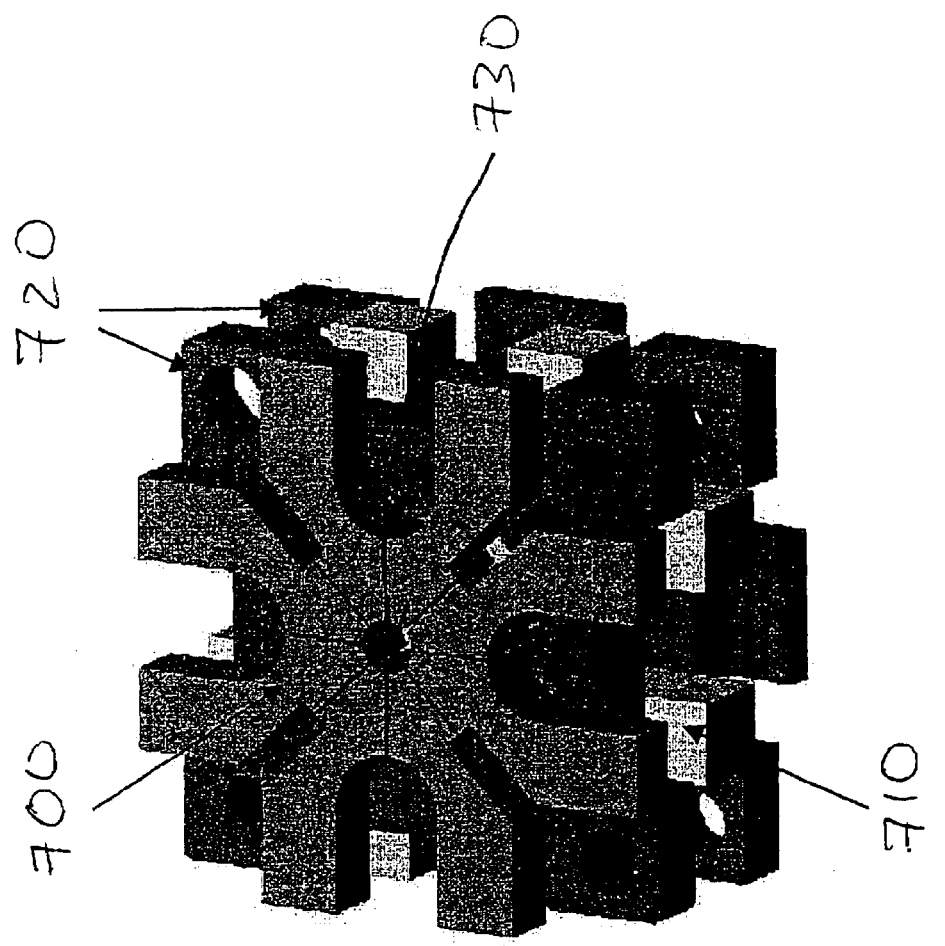
FIG. 7 shows a schematic representation of a deflector assembly.

In a preferred embodiment, the mainfield deflector 240 is composed of a set of double deflection octupoles, requiring 16 electrical connections. A deflector assembly is shown schematically in FIG. 7, comprising a mainfield deflector 700, a sub-field deflector 710, insulating ceramic 720, and showing the column bore 730. The bore 730 is typically 2 mm in diameter. In a preferred embodiment, the mainfield deflector 700 is fabricated using Ti alloy electrodes brazed to ceramic. Machining of the column bore 730 is done after brazing, so as to ensure concentricity of both octupole deflectors that comprise the mainfield deflector 700. Two octupole deflectors are used in order to ensure that the beamlet is telecentrically scanned on the wafer. Telecentric scanning means that the beamlet hits the wafer perpendicular to the wafer surface, and this allows for a larger depth of field of the focused beam at the wafer.

The mainfield deflectors have two functions: (1) tracking the stage motion as it moves the wafer during imaging, and (2) performing a large area scan to find alignment marks. The mainfield deflectors have a total deflection capability of approximately ±50 µm in both the X and Y directions on the wafer. However, at the edges of this scanfield, the aberrations in the beam are significant, and beam resolution and spot size will be affected. Modeling of beam resolution and spot size has been carried out using SIMION 3D, ver. 6.0 and MEBS software. These calculations indicate that the imaging field, within which the spot size is sufficiently small to image a single pixel area (25×25 nm), is approximately ±10 µm in X and Y for the mainfield deflectors.

In its second function, the mainfield deflectors are used to search for alignment marks on the wafer. This is achieved by scanning the full scan field (i 50 µm square) on the wafer to find the alignment marks. Global positioning should be sufficiently accurate to place the alignment marks within this scan field. Although the resolution or spot size of the beamlet may not be as small as is needed for imaging, it will be sufficient for the location of the alignment marks. The alignment marks are imaged using the secondary electrons that are emitted from the wafer surface and are collected by the secondary electron (SE) detectors. Typical alignment mark metals can be, but are not limited to, gold, tungsten, and titanium-tungsten.

The bandwidth of the applied voltage signal for the mainfield deflectors is determined by the desired scan speed in order to find the alignment marks on the wafer. Typically, a bandwidth of roughly 50 kHz is more than sufficient for the mainfield deflectors.

In a preferred embodiment of the invention, the subfield deflector 710 is a quadrupole deflector with 4' independent electrodes. In another embodiment, an octupole deflector could be used. Because an octupole deflector has double the number of connections as a quadrupole deflector, an octupole deflector would only be used if aberrations using a quadrupole deflector resulted in increased spot size. The subfield deflector 710 only requires a single deflector because it is located closer to the back focal plane of the focusing lenses. Therefore, telecentric scanning can be achieved with only a single deflector. A subfield deflector 710 is fabricated in a similar fashion to a mainfield deflector 700.

The subfield deflector is used to scan the beamlet over the wafer during the imaging process. A typical scan distance on the wafer is ±5 $\mu$M. This results in a 10 $\mu$m wide stripe imaged on the wafer (see FIG. 3). After imaging a single stripe, the subfield deflectors quickly bring the beamlet back to the starting point to scan again.

Figure 8:
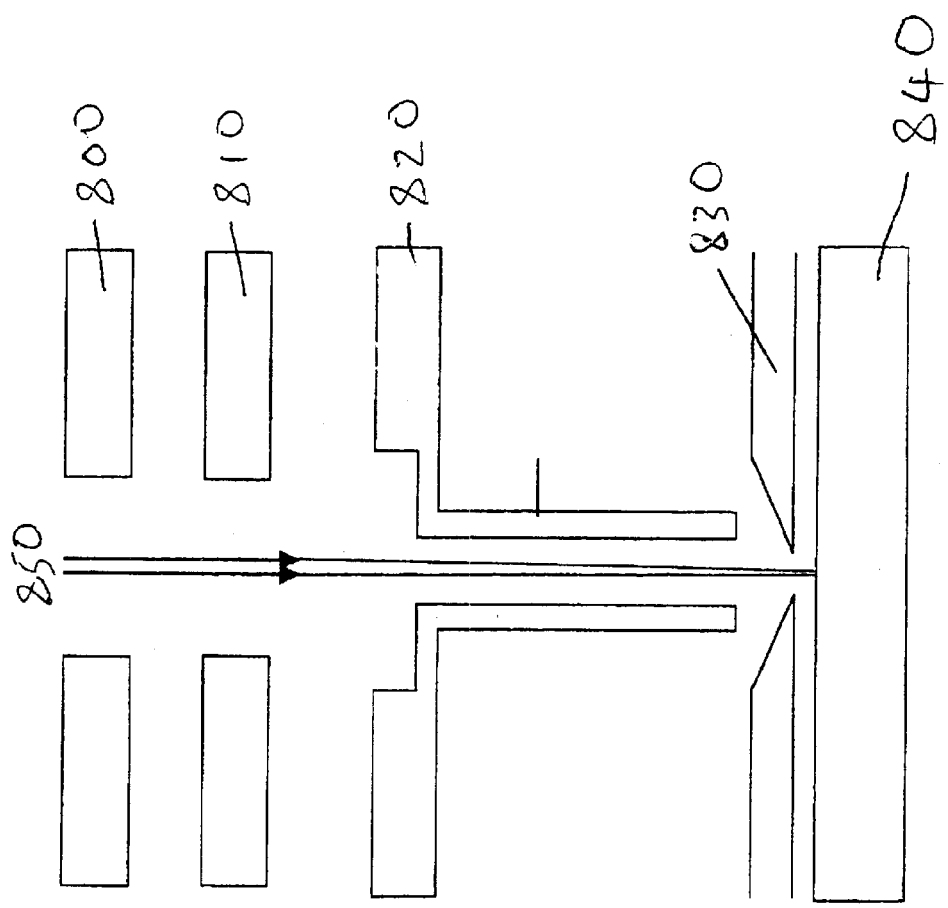
FIG. 8 shows a schematic cross-sectional representation of focusing optics.

A schematic cross-sectional representation of the focusing electron optics is shown in FIG. 8, comprising focus lens 1 800, focus lens 2 810, field-free tube 820, voltage contrast plate 830 wafer 840, and beamlet 850. The primary function of the focusing optics is to focus thee beamlet 850 to a small spot on the wafer 850. In a preferred embodiment this is achieved using simple cylindrical lenses with a bore diameter of roughly 2 mm. The strongest focusing occurs between focus lens 2 810 and the field-free tube 820, as this is the location of the highest electric field. Initial calculations using SIMION 3D, ver 6.0 indicate that typical potentials applied to the focus elements are as follows: focus lens 1=6,000 V, focus lens 2=7,200 V, field-free tube=980 V. The potential on focus lens 2 is the primary adjustment used for obtaining a focused spot on the wafer. In a preferred embodiment, focus lens 2 is independently controlled for each column, while focus lens 1 and the field-free tube are common to all of the columns. In a preferred embodiment these electron optical elements can all be made out of any vacuum compatible, non-magnetic metal.

Figure 9:
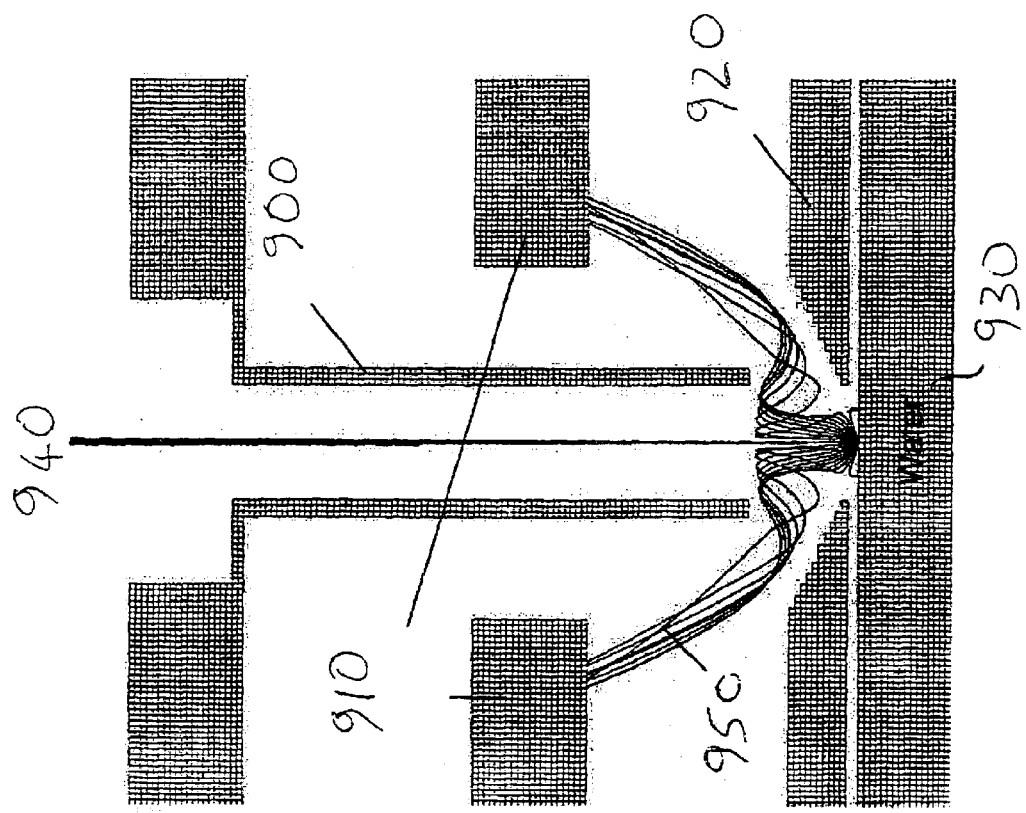
FIG. 9 illustrates electron beam trajectories for the focusing optics of FIG. 8.

The field-free tube 820 is held at a potential that is slightly lower than that of the wafer 840. In a preferred embodiment, the wafer 840 is held at 1 kV and the field-free tube 820 is held at 980 V. The purpose of the Field-Free Tube is to separate the secondary electrons (emitted from the wafer surface) from the primary electrons (in the beamlet). Most secondary electrons have an energy range that is less than 10 eV relative to the wafer, depending on the surface material of the wafer, the incoming primary electron energy, etc. As the secondary electrons are emitted from the surface, they travel towards the field-free tube 820. However, the secondary electrons have insufficient energy to enter the tube because of the negative 20 V differential between the field-free tube 820 and the wafer 840. Thus, the secondary electrons will be pushed away from the field-free tube 820. FIG. 9 shows the modeled trajectories of both the primary electrons and the secondary electrons as calculated by SIMION 3D, ver 6.0. FIG. 9 shows the a field-free tube 900, SE detectors 910, voltage contrast plate 920, wafer 930, primary electron trajectories 940 and secondary electron trajectories 950. As can be seen, the primary electrons are focused down to a small spot on the wafer, and the secondary electrons are emitted from the surface of this wafer at this point. The secondary electrons are emitted in roughly a Lambertian angular distribution (cos $\theta$). A few of the secondary electrons return to the wafer, but the vast majority of the electrons travel up towards the field-free tube 900. As the secondary electrons reach the edge of the field-free tube 900, the electric field generated by the SE detectors 910 (held at roughly 5 kV), cause the secondary electrons to be accelerated towards the detectors 910. The secondary electron collection efficiency of the SE detectors 910 using this electron optical design has been calculated using SIMION 3D, ver 6.0 to be approximately 80% of all secondary electrons emitted from the surface of the wafer.

The voltage contrast plate 920, shown in FIG. 9 to be positioned directly above the wafer 930, has two functions: (1) enhance secondary electron collection efficiency and (2) allow for voltage contrast imaging of the wafer surface. The voltage contrast plate 920 is held a very short distance above the wafer 930 (roughly 100 $\mu$m in the preferred embodiment). This spacing can be maintained by using an electrostatic chuck to hold the wafer down flat, and by using several laser triangulators on the wafer stage to allow for correction of the wafer position relative to the voltage contrast plate in six degrees of freedom. The voltage contrast plate 920 has a small (roughly 1 mm) hole through which the primary and secondary electrons travel. The sides of the hole are beveled at an angle of arctan(0.5) with respect to the wafer surface to assist in creating a field-free region on the wafer when the voltage contrast plate is held at a potential very close to the wafer (typically about 995 V if the wafer is at 1 kV). This field-free region allows the secondary electrons to escape the surface more efficiently as they travel towards the SE detectors. The voltage applied to the voltage contrast plate can be adjusted so as to force low energy secondary electrons back to the wafer surface. If the secondary electrons have sufficient energy, then they will be able to escape this field and reach the SE detectors; however, if the secondary electrons do not have sufficient energy, then they will return to the wafer. Thus, the voltage contrast plate acts as an electron energy high pass filter, blocking low energy electrons and allowing high energy electrons to be detected. The potential can be adjusted so that the high pass electron energy filter can be tuned. Changing the voltage contrast plate potential results in small changes in the focusing of the primary beam, but this can be compensated for by using the main focusing optics to maintain a small spot size.

The SE detector 910, shown in FIG. 9 can be a standard electron detector. This detector 910 is positioned between the field-free tube and the wafer 930, and is typically either a uniform annular detector, or a multi-sectored detector. A multi-sectored detector can detect topographical information by adding angular information to the detected signal. An example of contrast due to angular variation in the secondary signal is shading. Shading occurs because three dimensional features can block trajectories of emitted electrons over the angular range where the obstruction occurs. In a preferred embodiment of the present invention, the SE detector 910 is a four-quadrant detector; this detector 910 is held at a potential of roughly 5 kV, which allows for efficient signal gain. The secondary electrons are emitted from the wafer 930 in a field free region towards the column. Because the field-free tube 900 at the end of the column is held at a potential lower than the wafer 930, the electrons will be repelled from the field-free tube 900 and swept towards the SE detectors 910. This efficiently separates the secondary electrons from the primary electrons. With a state of the art solid state detector, calculations indicate that the imaging bandwidth can be roughly 100 MHz or higher.

Figure 10:
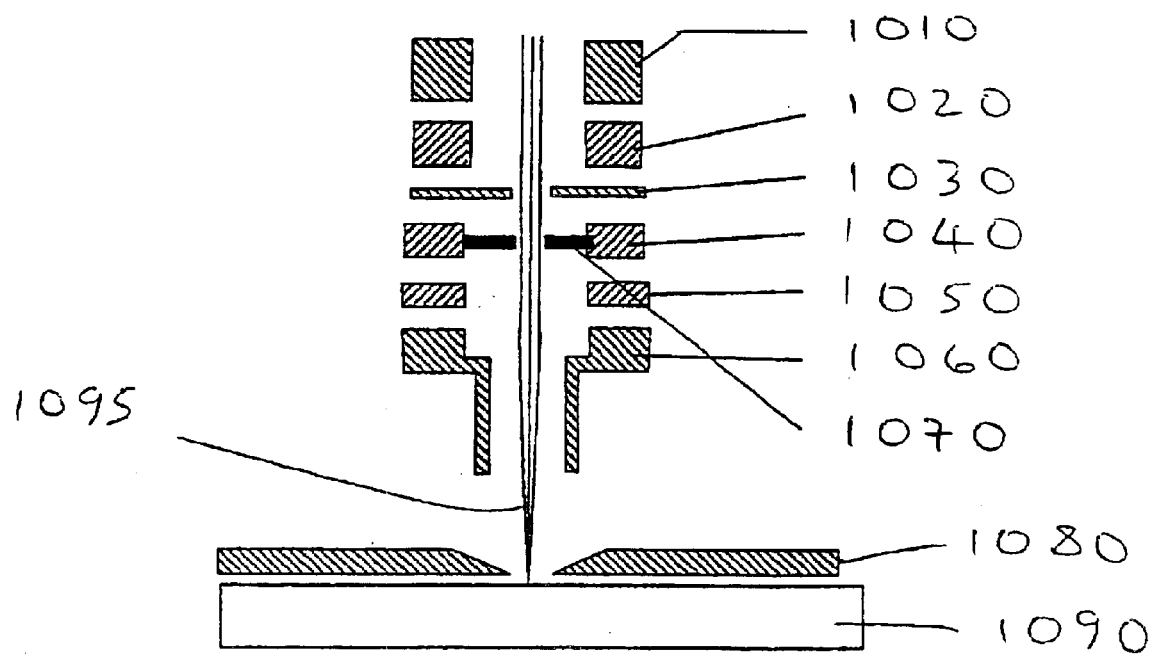
FIG. 10 shows a schematic cross-sectional representation of a single column with an annular secondary electron detector.
Figure 11:
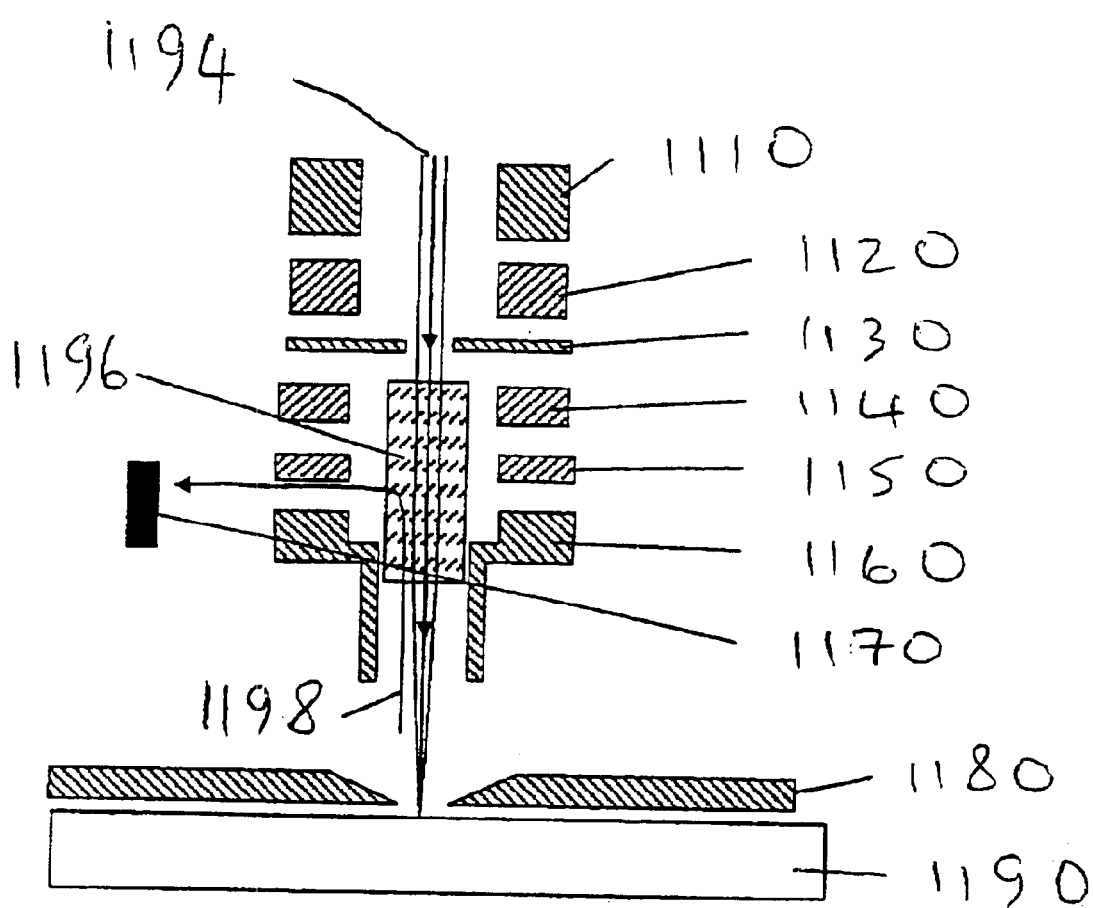
FIG. 11 shows a schematic cross-sectional representation of a single column with a Wein filter.

FIG. 10 and FIG. 11 show further embodiments, with different types of SE detector with different positions in the electron optical column. FIG. 10 shows mainfield deflector 1010, subfield deflector 1020, blanking aperture 1030, focusing lens 1 1040, focusing lens 2 1050, field-free tube 1060, annular SE detector 1070, voltage contrast plate 1080, wafer 1090 and beamlet 1095. The SE detector 1070 is positioned within the bore of the optical column, and is annular. The voltage applied to the field-free tube 1060 will need to be adjusted so that secondary electrons can penetrate the column bore and reach the SE detector 1070. FIG. 11 shows mainfield deflector 1110, subfield deflector 1120, blanking aperture 1130, focusing lens 1 1140, focusing lens 2 1150, field-free tube 160, SE detector 1170, voltage contrast plate 1180, wafer 1190, beamlet 1194, Wein filter 1196 and secondary electrons 1198. The SE detector 1170 is positioned off to the side of the column. In this approach, a magnetic lens (Wein filter 1196) is required to separate the secondary electrons 1198 from the primary electrons (beamlet 1194).

Figure 12:
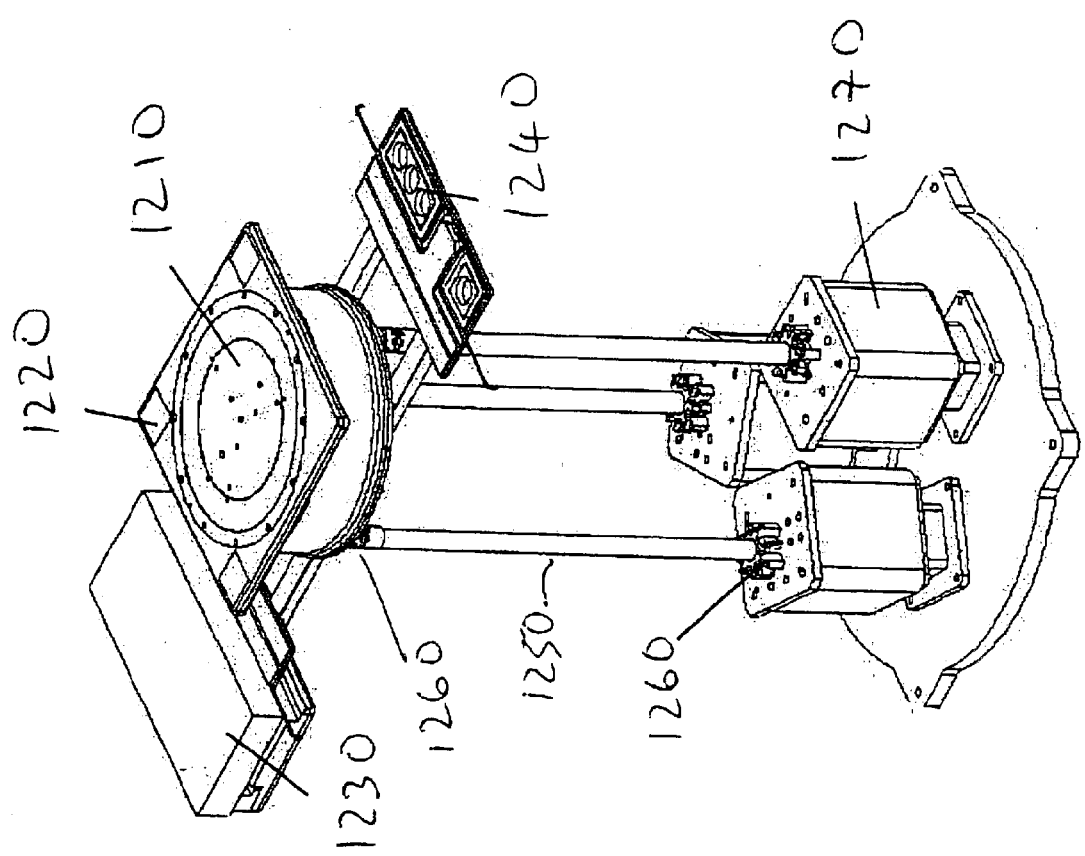
FIG. 12 shows a schematic representation of a wafer stage.

The wafer stage is a critical component in a wafer inspection system, and is described in U.S. patent application Ser. No. 09/543,265 entitled "Precision Stage" filed Apr. 5, 2000, herein incorporated by reference. For a multi-column electron beam inspection system it is critical that the stage be able to position the wafer so that it is parallel to the voltage contrast plate (positioning the wafer correctly for all imaging columns simultaneously); this requires a stage with 6 degrees of freedom of movement. Such a stage is schematically shown in FIG. 12 comprising electrostatic chuck 1210, mirror plates 1220, magnets 1230, X-Y linear motor coils 1240, legs 1250, flex joints 1260, and Z-axis actuators 1270. The stage needs to accurately position the wafer to within several nanometers so that image data can be compared without error. Positional measurements are made with laser interferometers that are accurate to sub-nanometer resolution. This information is used in a feedback loop to the stage controller to position the stage accurately. Another function of the stage is to perform the slow axis movement, as shown in FIG. 3.

Another requirement for the stage is low vibration and good vibration isolation. Because a multicolumn system does not require the stage to move over the entire wafer but only over small areas of several dies, other types of stages than the conventional roller bearing type can be used. Roller bearing stages have an inherent problem of small vibrations due to the ball bearings not being perfectly round and the ways not being perfectly flat. The use of flexure joints 1260 in the stage allows for a smooth low vibration motion. Vibration isolation can be controlled in the lateral direction by the use of force motors (magnets 1230 and coils 1240).

Another requirement for the stage is to be able to position the wafer extremely close to the electron optical components. A very short working distance improves lens aberrations, which limit the spot size, and aids in the collection efficiency of the secondary electron s. The key to achieving a close working distance is to keep the wafer flat using an electrostatic chuck 1210 to clamp the wafer and the use of a measurement and positional system that can measure and position the wafer to 6 degrees of freedom (DoF). With this type of stage control it is practical to maintain a working distance of 0.1 mm or smaller.

Figure 13:
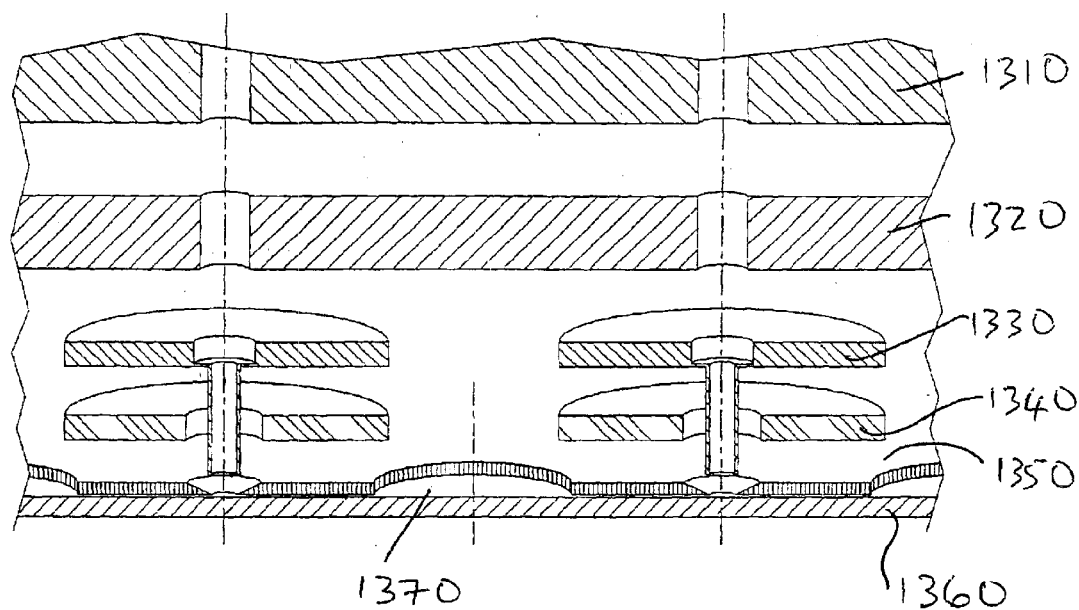
FIG. 13 shows a schematic cross-sectional representation of pumping apertures within a multi-column assembly.

With the gap between the wafer and the columns being small, special care must to be taken to vacuum pump this region. Special pumping holes may be necessary to insure that any possible pressure rise due to outgassing (the release of gas molecules from the wafer) is minimized. FIG. 13 shows focus lens 1 1310, focus lens 2 1320, field-free tubes 1330, SE detectors 1340, voltage contrast plate 1350, wafer 1360 and pump holes 1370.

Figure 14:
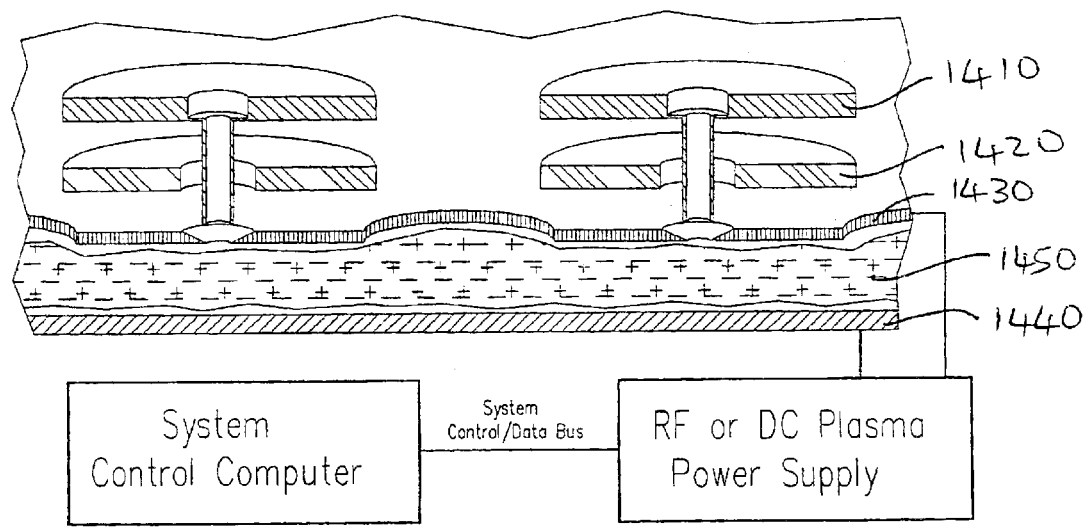
FIG. 14 shows a schematic cross-sectional representation of the lower part of a multi-column assembly during plasma cleaning.

The stage and column may also be configured to allow for plasma cleaning of the lower electron optical elements of the multiple columns, as shown in FIG. 14. FIG. 14 shows field-free tubes 1410, SE detectors 1420, voltage contrast plate 1430, wafer 1440, plasma 1450 and power supply and controller. Outgassing from wafers can contaminate the electron optical elements. This contamination can, result in unwanted distortions to the electron beam. In a conventional SEM, apertures and parts of the column are cleaned on a periodic basis. The advantage of plasma cleaning is that is does not require disassembly of the system but can be done in-situ by applying sufficient voltage across the gap between the wafer 1440 and the voltage contrast plate 1430, while the vacuum is filled with a partial pressure of an active gas, such as hydrogen.

Figure 15:
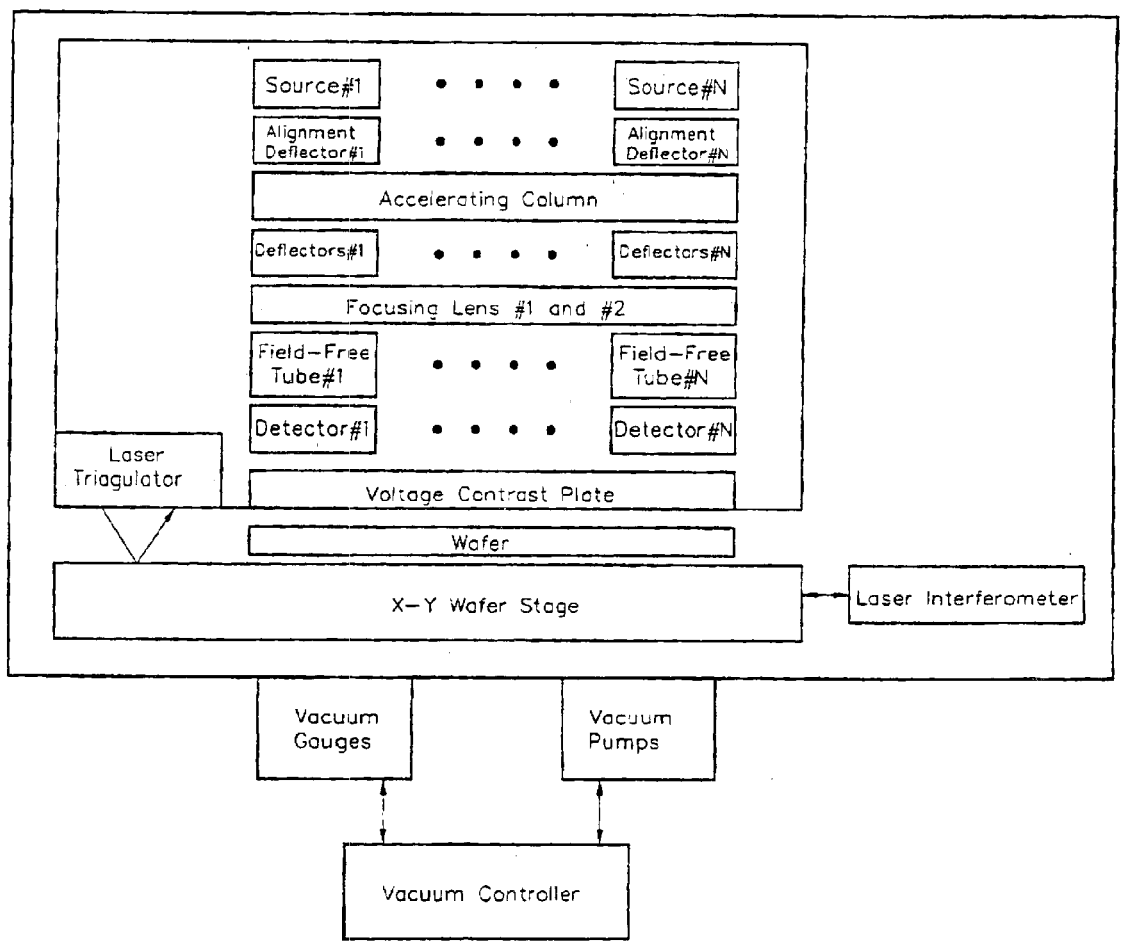
FIG. 15 shows a block diagram of a multi-column assembly and wafer stage.

FIG. 15 shows a block diagram of the different components within a preferred embodiment of the present invention in terms of the electron optics assembly and stage. As can be seen, the source, alignment deflectors, mainfield deflectors, sub-field deflectors, field-free tubes and SE detectors are independent for each column. The accelerating column, focus lens 1, focus lens 2, and voltage contrast plate are common for all columns. The wafer sits on a wafer stage that is carefully monitored and controlled using laser triangulators and laser interferometers. Vacuum pumps maintain a vacuum pressure in the range of $10^{-7}$ to $10^{-8}$ Torr at the wafer, and a pressure that is roughly one to two orders of magnitude lower at the sources (this pressure difference can be maintained by using differential pumping apertures in each column).

Figure 16:
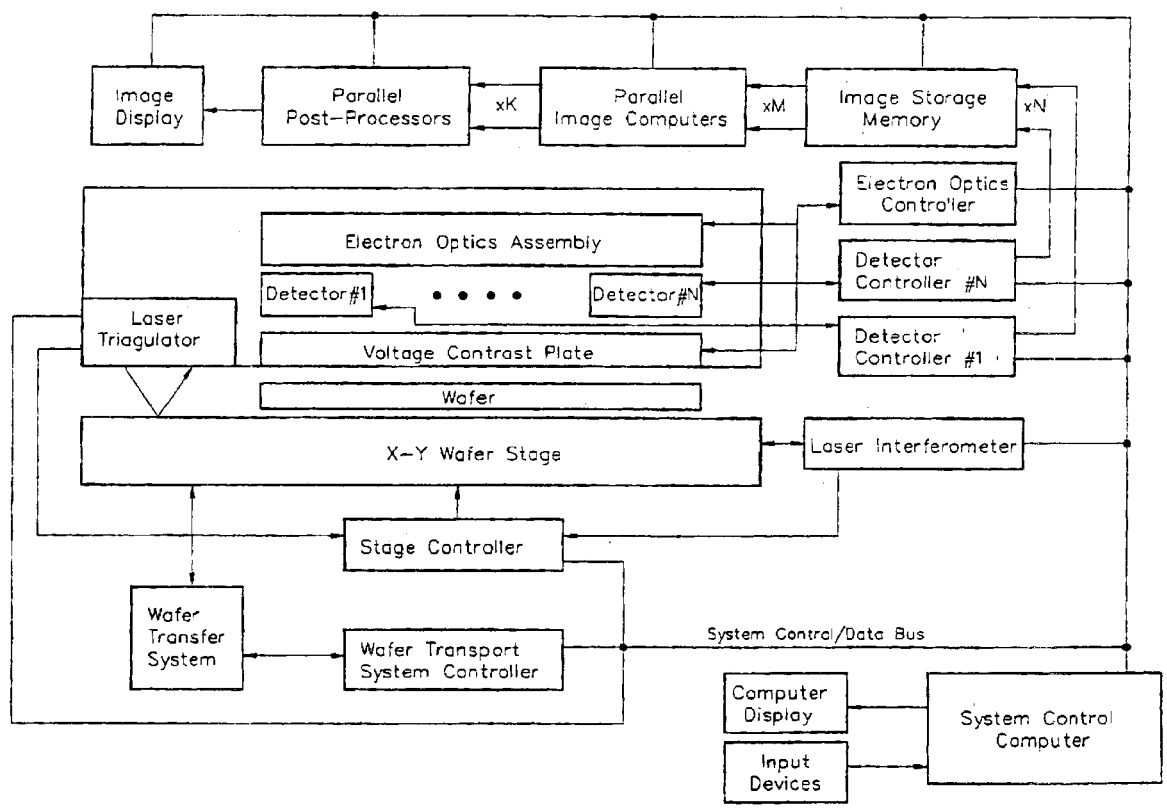
FIG. 16 shows a block diagram of a multi-column electron beam inspection system.

An inspection system can be broken down into several key components: an imaging system to acquire pattern data for pattern analysis, a stage to move the wafer under the image acquiring system, a memory system for storing the data, an image computer which analyzes the pattern data, a post processor, a control computer for coordinating the inspection with all the other elements of the system, electronics to drive the system, a vacuum system required for electron beams, and a wafer loading and handling mechanism. The components in a preferred embodiment of the present invention are shown in FIG. 16. Note that the duplication of components for this system is such that N is greater than or equal to M, and M is greater than or equal to K.

In a wafer inspection, the image data is analyzed by a customized image computer which allows for flexibility in data format. One of the flexible elements is that the slow axis of the raster scan (see FIG. 3) can be performed with the stage. With this strategy, the image data can be acquired in "swaths" and stored in computer memory. The height of the swath is determined by the strength of the deflectors which deflect the beam electrostatically, and the length of the swath is the length of the stage travel. The length of the swath is typically determined by the amount of available computer memory.

After the data has been collected, the information is transferred to an image computer that analyzes the data using preprogrammed algorithms. The simplest of these algorithms subtracts the data from two pixels that have the same pattern information. If there is a difference between the values of these two pixels, and this difference is greater than some parameter or threshold, then that pixel is determined to be a defect. All the defect information is then sent to a post processor which maps the defects by location and classifies them by type. This defect classification can be performed manually by an operator or in an automatic mode by using a defect analysis computer.

In other embodiments of the present invention, the column spacing could be adjustable, with the columns positioned such that each column would inspect a single die. This would simplify the image processing in terms of data stitching between adjacent columns; however, this would greatly increase the mechanical complexity of the column design since each column would need to be positioned accurately to within roughly 5 μm (the scan size of the mainfield deflectors). If this approach is followed, a series of piezoelectric inchworms could be mounted between each row and column. In another embodiment, the alignment deflectors could be fabricated directly on the electron gun assembly rather than as a separate component within the accelerating region. In a further embodiment, the subfiled deflectors could be octupole or dodecapole deflectors rather than quadrupole deflectors. In another embodiment, the field-free tube could be replaced with a grid to allow for improved voltage contrast adjustment. In a further embodiment, the focusing system could be improved by using fewer or more focusing lenses. Fewer focusing elements: would simplify the mechanical design, while more focusing elements could improve spot size and depth of field. In another embodiment, it may be possible to improve upon the secondary electron collection efficiency by using lenses of different shapes (rather than simple cylindrical lenses). In a further embodiment, the wafer could range in voltage from 200 V–2,000 V rather than being fixed at 1 kV. In another embodiment, the use of magnetic lenses and deflectors could be introduced. In a further embodiment, a snorkel lens, which is a magnetic lens that resides below the wafer and causes the electrons to spiral up the field lines towards a detector, could be used to aid in secondary electron collection efficiency. In another embodiment, the detector could have 1, 2, 3, or more sectors. In a further embodiment the beam limiting apertures could be fabricated by conventional machining (as opposed to micromachining); furthermore, in some embodiments the electron optical columns could function satisfactorily without beam limiting apertures.

What is claimed is:

1. An electron optical column comprising:
   means for generating an electron beam;
   a voltage contrast plate with a plate aperture, the edge of which is beveled at an angle so as to produce an electric field free region below said aperture on the surface of a specimen substrate situated immediately below said voltage contrast plate; and
   an annular secondary electron detector centered on the optic axis of said column and positioned above said voltage contrast plate.

2. An electron optical column as in claim 1, further comprising a focus lens situated between said detector and said voltage contrast plate.

3. An electron optical column as in claim 1, further comprising:
   a first focus lens;
   wherein said detector is situated within the bore of said first focus lens.

4. An electron optical column as in claim 3, further comprising a second focus lens positioned axially adjacent to said first focus lens.

5. An electron optical column as in claim 4, wherein said first and second focus lenses are electrostatic lenses.

6. An electron optical column as in claim 1, further comprising a scanning deflector situated above said detector.

7. An electron optical column as in claim 6, wherein said scanning deflector comprises a first deflector and a second deflector configured to provide telecentric scanning of said electron beam on said specimen substrate positioned below said voltage contrast plate.

8. An electron optical column as in claim 7, wherein said scanning deflectors are electrostatic deflectors.

9. An electron optical column as in claim 7, wherein said scanning deflectors are octupole deflectors.

10. An electron optics assembly for a multi-column electron optical system comprising:
    means for generating a multiplicity of electron beams;
    a single voltage contrast plate with a multiplicity of plate apertures, such that there is a corresponding plate aperture for each column, the edges of said plate apertures are beveled at an angle so as to produce electric field free regions below said apertures on the surface of a wafer situated immediately below said voltage contrast plate; and
    a multiplicity of annular secondary electron detectors centered on the optic axes of corresponding columns and positioned above said voltage contrast plate.

11. An electron optics assembly as in claim 10 further comprising a focus plate situated between said voltage contrast plate and said multiplicity of detectors, said focus plate having a multiplicity of focus apertures configured such that there is a corresponding focus aperture for each column.

12. An electron optics assembly as in claim 10 further comprising:
    a first focus plate, said focus plate having a multiplicity of first focus apertures configured such that there is a corresponding first focus aperture for each column;
    wherein said detectors are situated within corresponding first focus apertures.

13. An electron optics assembly as in claim 12 further comprising a second focus plate positioned adjacent to said first focus plate, said second focus plate having a multiplicity of second focus apertures configured such that there is a corresponding second focus aperture for each column.

14. An electron optics assembly as in claim 10 further comprising a multiplicity of scanning deflectors situated above said detectors, such that there is a corresponding scanning deflector for each column.

15. An electron optics assembly as in claim 14 wherein each said scanning deflector comprises a first deflector and a second deflector configured to provide telecentric scanning of said electron beams on a specimen substrate positioned below said voltage contrast plate.

16. An electron optics assembly as in claim 15 wherein each said scanning deflector is an electrostatic deflector.

17. An electron optics assembly as in claim 15 wherein each said scanning deflector is an octupole deflector.

* * * * *